United States Patent [19]
Sardella et al.

[11] Patent Number: 5,406,351
[45] Date of Patent: Apr. 11, 1995

[54] PHOTOLITHOGRAPHY SYSTEM WITH IMPROVED ILLUMINATION

[75] Inventors: John C. Sardella, Highland Village; Gregory J. Stagaman, Dallas, both of Tex.

[73] Assignee: SGS-Thomson Microelectronics, Inc., Carrollton, Tex.

[21] Appl. No.: 175,963

[22] Filed: Dec. 30, 1993

[51] Int. Cl.$^6$ .................... G03B 27/42; G03B 27/54
[52] U.S. Cl. .......................... 355/53; 355/1; 355/70
[58] Field of Search .............. 355/1, 53, 67, 70

[56] References Cited

U.S. PATENT DOCUMENTS

| | | | |
|---|---|---|---|
| 4,450,358 | 5/1984 | Reynolds | 250/492.1 |
| 4,493,555 | 1/1985 | Reynolds | 356/358 |
| 4,498,009 | 2/1985 | Reynolds | 250/452.1 |
| 4,560,235 | 12/1985 | Servaes | 350/96.24 |
| 4,681,414 | 7/1987 | Hershel | 353/102 |
| 5,286,963 | 2/1994 | Torigoe | 250/201.2 |
| 5,302,999 | 4/1994 | Oshida et al. | 355/1 |
| 5,303,001 | 4/1994 | Jeong et al. | 355/53 |

OTHER PUBLICATIONS

SPIE, vol. 1088 Optical/Laser Microlithography II (1989), Excimer Laser Stepper for Sub-half Micron Lithography, Akikazu Tanimoto et al.; Nikon Corp.
SPIE, vol. 633 Optical Microlithography V (1986), Excimer laser-based lithography: a deep ultrioviolet wafer stepper; Pol et al.; AT&T Bell Laboratories.
SPIE, vol. 1264 Optical/Laser Microlithography III (1990), Reduction Lens and Illumination System for Dee-UV-Aligners; Liegel et al.; Carl Zeiss, West Germany.
PAS 5500 User Guide Release 3, ASM Lithography BV, Veldhoven, The Netherlands, 1993.

*Primary Examiner*—Richard A. Wintercorn
*Attorney, Agent, or Firm*—Robert Groover; Lisa K. Jorgenson; Richard K. Robinson

[57] ABSTRACT

A photolithographic system wherein optical fiber routing is used to combine two or more ultraviolet light sources for reticle illumination.

45 Claims, 4 Drawing Sheets

PHOTOLITHOGRAPHY SYSTEM WITH IMPROVED ILLUMINATION

BACKGROUND AND SUMMARY OF THE INVENTION

The present invention relates to wafer steppers, and to high-intensity ultraviolet light sources for use in them.

FIG. 1 shows an example of a "stepper" photolithography system. Such systems are commonly used in the manufacture of advanced integrated circuits. In such a system, an illuminator subsystem 100 illuminates a reticle (held in the reticle subsystem 200). The reticle contains a layout pattern for exposure of a single integrated circuit (or sometimes only a portion of an integrated circuit). A lens 300 images the illuminated reticle pattern onto a wafer, coated with photoresist, which is held on the wafer stage subsystem.

At the wafer surface, the dimensions which must be imaged may be well under half a micron. (As of 1993, 0.35 μm is being used in very advanced production processes.) This requires use of short wavelengths. (Typically the 365nm wavelength of a mercury arc, referred to the "I-line," is used for illumination in half-micron systems.) Moreover, to achieve correct photoresist exposure, the image brightness must be extremely uniform over the desired width of the image field. Moreover, to achieve correct photoresist exposure, the image brightness must be extremely uniform over the desired width of the image field. Moreover, to maximize throughput, it is desirable to have a reasonably high image brightness. These desiderata impose very severe constraints on the optical system, and lenses with very aggressive numerical aperture ("NA") values are typically used (often greater than 0.5, and even approaching 0.6 in the newest designs). Additional background on the optics of imaging systems may be found in A. Conrady, APPLIED OPTICS AND OPTICAL DESIGN (2 vols. 1960); R. Kingslake, LENS DESIGN FUNDAMENTALS (1978); R. Kingslake, OPTICAL SYSTEM DESIGN (1983); MICROCIRCUIT ENGINEERING 91 (1992); K. Valiev, PHYSICS OF SUBMICRON LITHOGRAPHY (1992); VLSI TECHNOLOGY (ed. Y. Tarui 1986); the series APPLIED OPTICS AND OPTICAL ENGINEERING; Franon, OPTICAL IMAGE FORMATION AND PROCESSING (1979); and the Optical Society of America's HANDBOOK OF OPTICS (1978); all of which are hereby incorporated by reference.

Lens design to satisfy these constraints is simplified if the light source is quasi-monochromatic (i.e. covers only a narrow range of wavelengths). This is normally done by filtering the light from a mercury arc lamp operated at relatively high power. Thus, a stepper illuminator consists of several optical elements which narrow the bandwidth of the mercury arc lamp illumination prior to reflecting the light down the optical column. Each of these elements reduces the intensity of the illumination, so that most of the optical power output of the arc lamp is necessarily wasted. In order to get more illumination intensity the size of the lamp has been increased from 350 W to up to 1500 W. However, the intensity at the I-line wavelength (365 nm) is already very small when compared to G-line (438 nm), so increasing the size of the lamp does not linearly increase the amount of I-line illumination. The size of the lamp is also limited due to the amount of heat generated, which will degrade the optical component coating. Thus, brightness is very much at a premium in the stepper illumination stage.

INNOVATIVE PHOTOLITHOGRAPHY SYSTEM WITH IMPROVED ILLUMINATION

The disclosed innovations provide a method to increase the amount of I-line intensity fed to the optical column without increasing the size of the lamp.

The proposed method adds a second illuminator to the optical light path. This illuminator can be the same size as the current illuminator. From the mercury arc lamp light is reflected into a fiberoptic bundle. Each illuminator has a fiber-optic bundle attached. The bundles are then tied together prior to the light integrator. The light from both illuminators is then combined in the integrator. The light then passes normally off a reflecting mirror down the optical column.

It may be necessary, due to the large intensity gain which will generate heat, to cool one or more of the elements in the light path (integrator, reflecting mirror, etc.). This can be done by running a temperature-controlled water jacket around the required elements.

In one class of embodiments, this superior light-gathering ability of the disclosed inventions may permit "Deep-UV" operation, at arc-generated wavelengths beyond I-line. Experiments with excimer laser sources have demonstrated the possibility of operation at 248 and 193 nm, but excimer sources are extremely expensive. The present invention can be used to collect the filtered light from multiple arc sources, in order to achieve sufficient illumination power for efficient exposure.

According to a disclosed class of innovative embodiments, there is provided: a photolithography system, comprising: at least two separate optical sources which emit ultraviolet light; multiple bundles of optical fibers, each having a first end positioned to collect light from a respective one of said optical sources and a second end which emits light collected at said first end, said second ends of said bundles being collocated to provide an extended light source; a reticle holder configured to support and precisely define the location of a reticle; a movable wafer stage configured to support and precisely define the location of a wafer of partially fabricated integrated circuits; an imaging lens configured and positioned to image the reticle held in said reticle holder onto the surface of the wafer held in said wafer stage; and an optical illumination subsystem which translates ultraviolet light emitted by said second ends of said optical fiber bundles to provide substantially uniform illumination onto the back side of the reticle held in said reticle holder.

According to another disclosed class of innovative embodiments, there is provided: a photolithography system, comprising: at least two separate arc lamps; multiple bundles of optical fibers, each having a first end positioned to collect light from a respective one of said arc lamps and a second end which emits light collected at said first end, said second ends of said bundles being collocated; optical filter elements positioned to eliminate visible and infrared wavelengths from light transmitted by said bundles; a reticle holder configured to support and precisely define the location of a reticle; a movable wafer stage configured to support and precisely define the location of a wafer of partially fabricated integrated circuits; and an imaging lens configured and positioned to image the reticle held in said reticle holder onto the surface of the wafer held in said wafer stage; an optical illumination subsystem which translates ultraviolet light emitted by said second ends of said optical fiber bundles to provide substantially uniform illumination onto the back side of the reticle held in said reticle holder.

According to another disclosed class of innovative embodiments, there is provided: a photolithography system, comprising: a movable wafer stage configured to support and precisely define the location of a wafer of partially fabricated integrated circuits; a reticle holder configured to support and precisely define the location of a reticle; an imaging lens configured and positioned to image the reticle held in said reticle holder onto the surface of the wafer held in said wafer stage; at least two optical sources which emit ultraviolet light; and an optical illumination subsystem which translates ultraviolet light emitted by said sources to provide substantially uniform illumination onto the back side of the reticle held in said reticle holder; wherein said illumination subsystem comprises multiple bundles of optical fibers, each coupled to a respective one of said optical sources and positioned to collect light therefrom.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
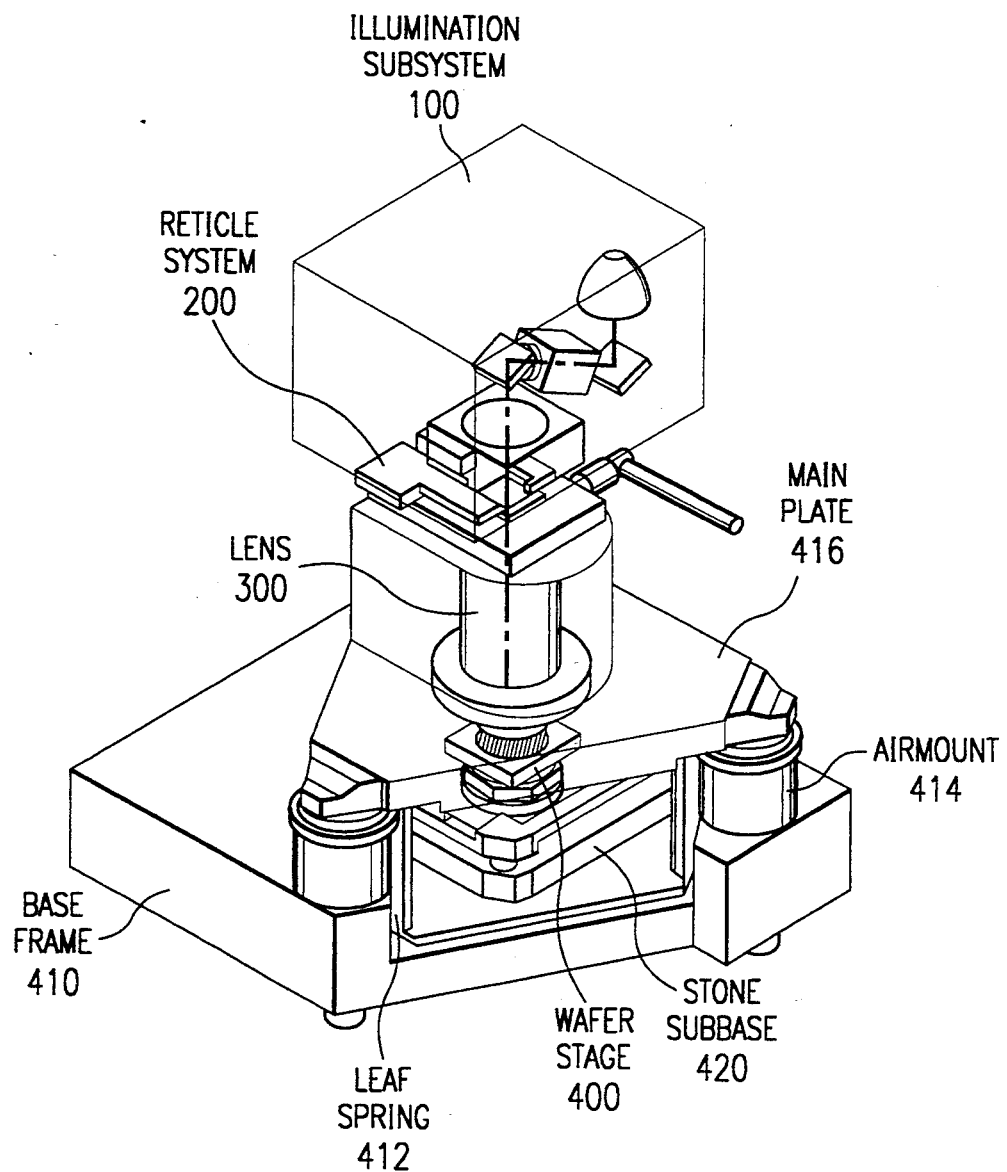
FIG. 1 shows an example of a "stepper" photolithography system.

FIG. 1 shows an example of a "stepper" photolithography system, into which the improvements provided by the disclosed innovations may advantageously be incorporated. (The example shown generally corresponds to a PAS5500 TM from ASM Lithography BV, Veldhoven, The Netherlands, but of course the disclosed innovations can also be incorporated into other systems too.) Such systems are commonly used in the manufacture of advanced integrated circuits. In such a system, an illuminator subsystem 100 illuminates a reticle (held in the reticle subsystem 200). The reticle contains a layout pattern for exposure of a single integrated circuit (or sometimes only a portion of an integrated circuit). A lens 300 images the illuminated reticle pattern onto a wafer, coated with photoresist, which is held on the wafer stage subsystem. (This subsystem includes not only the movable wafer stage 400, but also other support and anti-vibration structures, e.g. base frame 410, airmounts 414, main plate 416, leaf springs 412, and stone subbase 420.)

Figure 2:
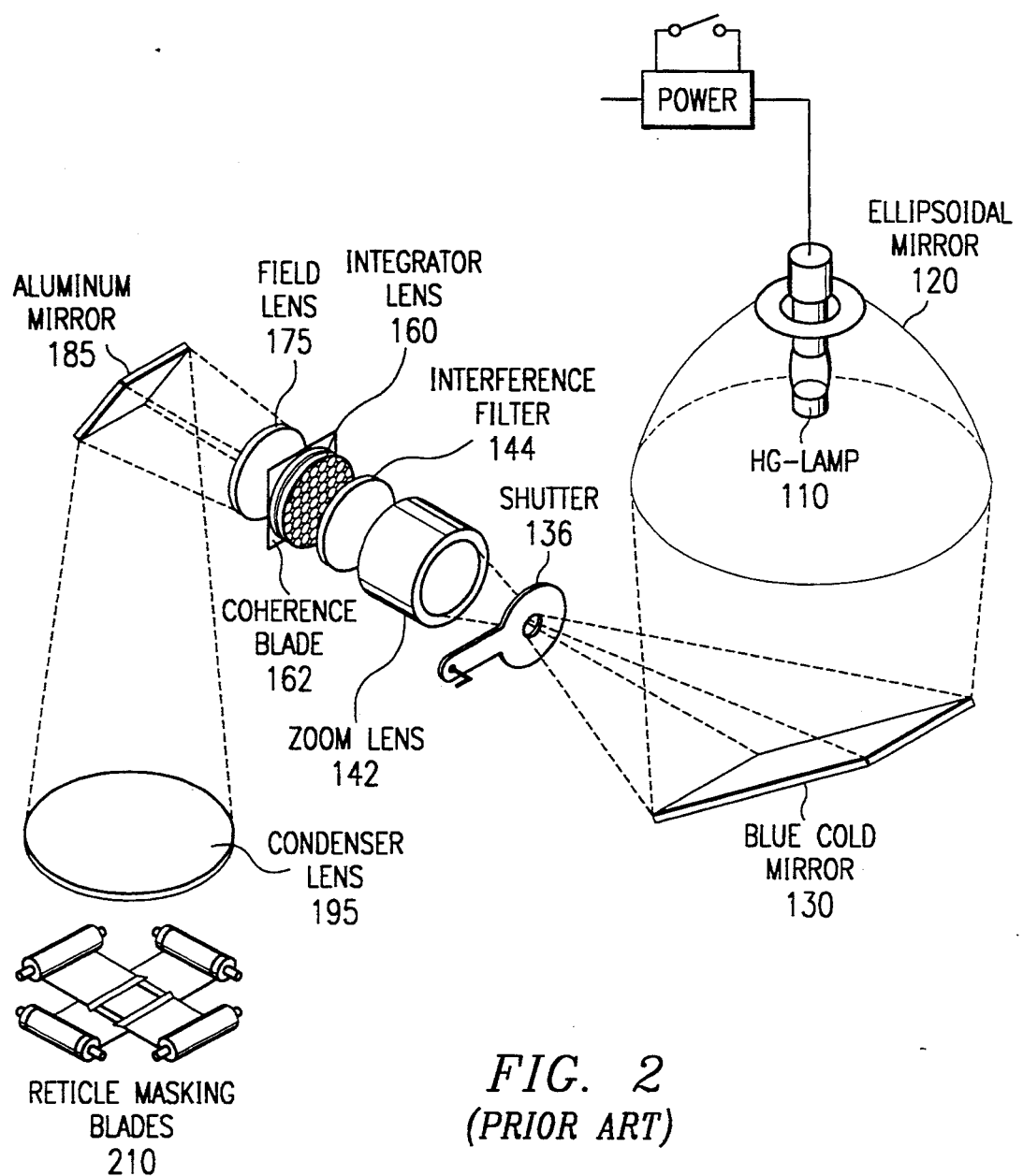
FIG. 2 shows the optical train of the illumination subsystem of the stepper of FIG. 1.

FIG. 2 shows the optical train of the conventional illumination subsystem 100 of the stepper of FIG. 1. A mercury arc lamp 110 is inserted into an ellipsoidal mirror 120 which can withstand the high heat output. A blue cold mirror 130 reflects the ultraviolet light output, but transmits the large infrared power as well as most of the visible. A metal shutter 136 is provided at the (reflected) second focus of the mirror 120, to chop the light output for power control. A zoom lens 142 captures the light passed through shutter 136, and interference filter 150 efficiently filters out the wavelengths longer than i-line.

The integrator lens 160 (which is typically located near the effective first focal plane of the condenser lens 190) increases the uniformity of illumination. This lens 160 alters the cone angle of light, and typically scrambles the light in doing so. Coherence blade 162 near integrator 160 is used to adjust the apparent size of the source, if desired.

The illuminated area which is seen by the condenser lens 190 is typically comparable to, or somewhat smaller than, the reticle size. Reticle size ranges up to about 15000 mm$^2$ in current production systems, and probably will not exceed 23 K mm$^2$ (which implies a diameter of about 150 mm) within the next few years.

Field lens 175, aluminum mirror 185, and condenser lens 190 provide the final part of the illuminator optical train, to illuminate the reticle for imaging by lens 300.

Figure 3A:
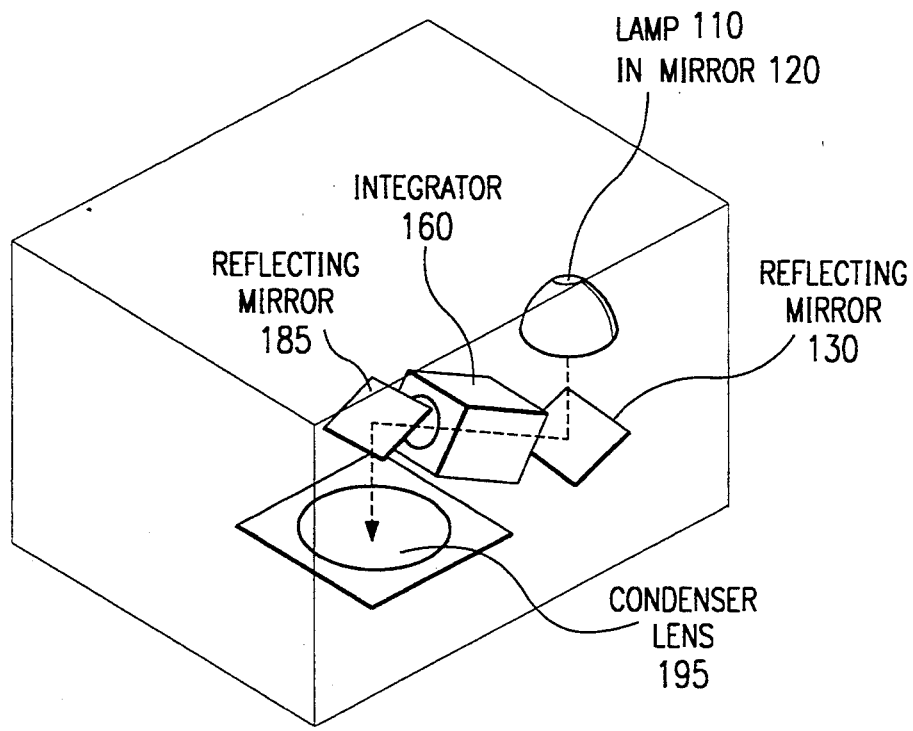
FIGS. 3A and 3B schematically show a conventional illuminator optical train like that of FIG. 2.
Figure 3B:
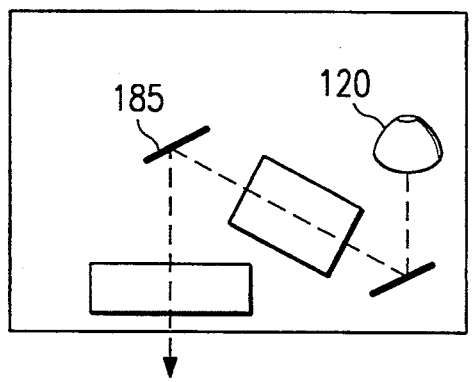

FIGS. 3A and 3B schematically illustrate key components of a conventional illuminator train like that of FIG. 2. (FIG. 3A shows an isometric view, and FIG. 3B shows an elevation.)

Figure 4A:
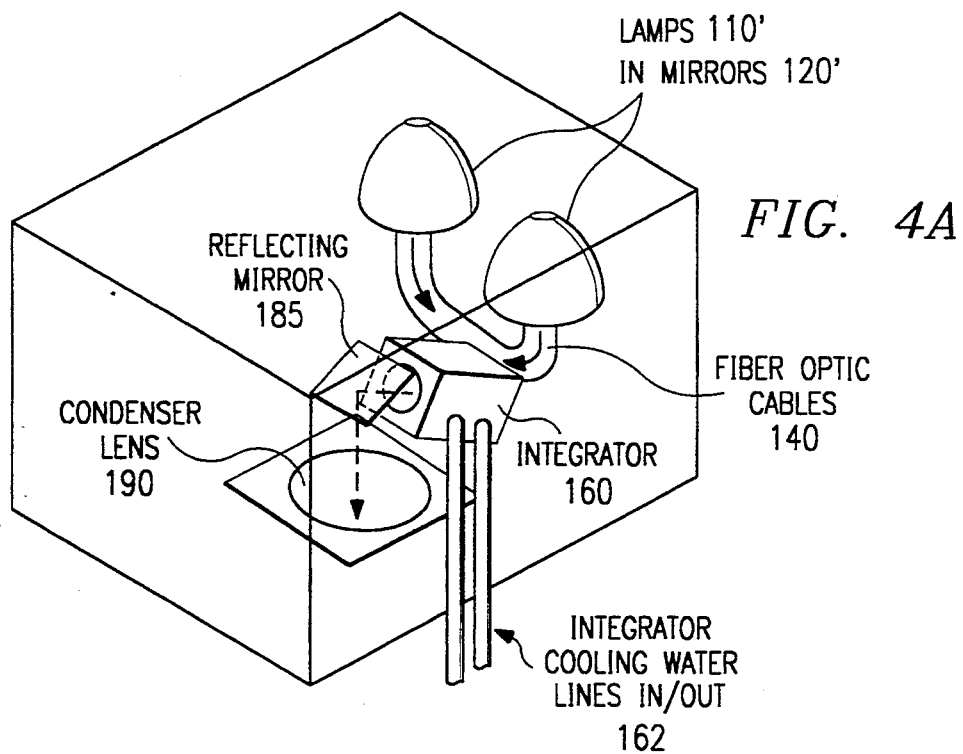
FIGS. 4A, 4B, and 4C schematically show the illuminator optical train provided by disclosed innovative embodiments.
Figure 4B:
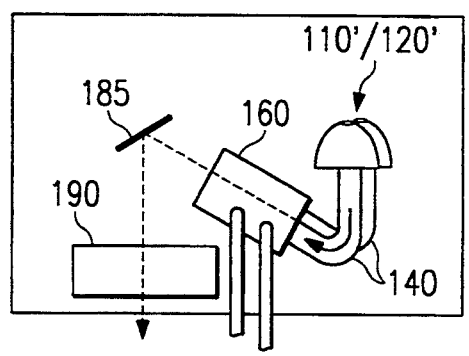
Figure 4C:
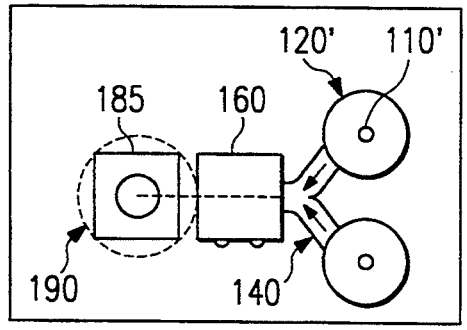

FIGS. 4A, 4B, and 4C schematically show the illuminator optical train provided by disclosed innovative embodiments. (FIG. 4A shows an isometric view, FIG. 4B shows an elevation, and FIG. 4C shows a section view.) A fiber optic bundle 140 is used to combine the light output from two lamps 110', each in its own reflector housing 110', to provide a light input to the integrator 160.

Spectral filtering can be performed either before or after the fiber optic bundle. Note that optional water Lines 162 provide a high cooling capacity at the integrator 160; water cooling in the integrator 160 can provide a greatly increased capability for heat removal. (In alternative embodiments the cold mirror 130 can be inserted in the optical path from each lamp 110' to its respective fiber bundle termination.)

To maximize uniformity, and provide good flexibility, a fairly small fiber diameter is preferably used. 100 $\mu$m fibers are used, in the presently preferred embodiment, but of course larger or smaller diameters can be used instead.

As is well known, sharp curvature of fibers can cause increased losses, and the routing of the fiber bundle 140 preferably includes no more curvature than is required by the physical requirements of placement.

The termination of the fiber bundle 140 is preferably a uniform closely-packed flat area of fiber ends. (Rounded fiber ends can optionally be used to narrow the emission cone of the fibers if desired.)

Off-the-shelf fibers can be used for operation at I-line. However, for operation at wavelengths below 300 nm, it may be preferable to use pure silica.

ADVANTAGES

The disclosed innovations provide at least the following advantages:

1. Increases the light intensity which increases throughput.
2. Lowers the lamp size requirements, which reduces the heat generated. This also increases the filter and integrator element lifetime.
3. Facilitates use of cheap arc sources for deep-UV lithography.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, the disclosed system can readily be adapted to combining the outputs of three or more lamps.

For another example, the integrator could optionally be reengineered for integration with the fiber bundle.

For another example, the fiber bundle and integrator could be jointly modified to provide an annular illumination source.

For another example, tapered fibers can be used to provide increased specific brightness.

For another example, spectral filtering is preferably performed before coupling the light into the fiber bundle, but alternatively (depending on heat load considerations) it may be preferable to do some or all of the filtering after the fiber bundle.

For another example, although the primary disclosed system uses a 5:1 minification, the disclosed innovations are equally applicable to systems which operate at 4:1, 2:1, 1:1, 10:1, or other rations.

For another example, although the system of the presently preferred embodiment uses a standard condenser lens, in future the condenser lens may be redesigned for an optimal match to a customized combination of fiber bundle and integrator.

For another example, although the foregoing discussion has primarily contemplated combining arc sources, the disclosed innovations can also be adapted to combining the outputs of excimer sources, laser sources of other kinds, frequency-doublers, or other sources of UV light. (Of course, some of these sources would not require as much filtration as an arc source.)

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A photolithography system, comprising:
   at least two separate optical sources which emit ultraviolet light;
   multiple bundles of optical fibers, each having a first end positioned to collect light from a respective one of said optical sources and a second end which emits light collected at said first end, said second ends of said bundles being collocated to provide an extended light source;
   a reticle holder configured to support and precisely define the location of a reticle;
   a movable wafer stage configured to support and precisely define the location of a wafer of partially fabricated integrated circuits;
   an imaging lens configured and positioned to image the reticle held in said reticle holder onto the surface of the wafer held in said wafer stage; and
   an optical illumination subsystem which translates ultraviolet light emitted by said second ends of said optical fiber bundles to provide substantially uniform illumination onto the back side of the reticle held in said reticle holder.

2. The system of claim 1, wherein each said optical source is optically filtered to remove wavelengths longer than about 365 nm.

3. The system of claim 1, wherein said imaging lens provides an image, on said wafer surface, which is reduced from the size of the reticle in said reticle holder.

4. The system of claim 1, wherein said optical illumination subsystem further comprises an integrator which homogenizes the distribution of light.

5. The system of claim 1, wherein said optical illumination subsystem further comprises a condenser lens having a numerical aperture greater than 0.25.

6. The system of claim 1, wherein said imaging lens has a numerical aperture in excess of 0.5.

7. The system of claim 1, wherein each said bundle of optical fibers consists of fibers less than 300 $\mu$m in diameter.

8. The system of claim 1, wherein each said bundle of optical fibers consists of fibers less than 1 mm in diameter.

9. The system of claim 1, further comprising at least one optical filtration stage which eliminates visible wavelengths.

10. The system of claim 1, wherein each said optical source is an arc source which includes mercury vapor.

11. The system of claim 1, wherein each said optical source operates at an output power of less than one kiloWatt.

12. The system of claim 1, wherein each said optical source operates at an output power of more than 500 Watts.

13. The system of claim 1, wherein each said optical source is an arc source.

14. The system of claim 1, wherein said second ends of said bundles include closely packed coplanar fiber ends.

15. The system of claim 1, wherein said second ends of said bundles include coplanar flat fiber ends.

16. The system of claim 1, wherein said second ends of said bundles jointly form a polygonal array of fiber ends.

17. A photolithography system, comprising:
   at least two separate arc lamps;
   multiple bundles of optical fibers, each having a first end positioned to collect light from a respective one of said arc lamps and a second end which emits light collected at said first end, said second ends of said bundles being collocated;
   optical filter elements positioned to eliminate visible and infrared wavelengths from light transmitted by said bundles;

a reticle holder configured to support and precisely define the location of a reticle;

a movable wafer stage configured to support and precisely define the location of a wafer of partially fabricated integrated circuits; and an imaging lens configured and positioned to image the reticle held in said reticle holder onto the surface of the wafer held in said wafer stage;

an optical illumination subsystem which translates ultraviolet light emitted by said second ends of said optical fiber bundles to provide substantially uniform illumination onto the back side of the reticle held in said reticle holder.

18. The system of claim 17, wherein each said arc lamp includes mercury vapor.

19. The system of claim 17, further comprising a respective cold mirror positioned in proximity to each said arc lamp, and wherein each said bundle is positioned to collect light reflected from said cold mirror.

20. The system of claim 17, further comprising a respective ellipsoidal mirror positioned to reflect light from each arc lamp toward said first end of said respective fiber bundle.

21. The system of claim 17, further comprising a cold mirror positioned to eliminate infrared light emitted by said arc lamps.

22. The system of claim 17, wherein each said arc lamp operates at an output power of less than one kiloWatt.

23. The system of claim 17, wherein each said optical source is optically filtered to remove wavelengths longer than about 365 nm.

24. The system of claim 17, wherein said imaging lens provides an image, on said wafer surface, which is reduced from the size of the reticle in said reticle holder.

25. The system of claim 17, wherein each said bundle of optical fibers consists of fibers less than 1 mm in diameter.

26. The system of claim 17, wherein said optical illumination subsystem further comprises an integrator which homogenizes the distribution of light.

27. The system of claim 17, wherein said optical illumination subsystem further comprises a condenser lens having a numerical aperture greater than 0.25.

28. The system of claim 17, wherein each said bundle of optical fibers consists of fibers less than 300 μm in diameter.

29. The system of claim 17, further comprising at least one optical filtration stage which eliminates visible wavelengths.

30. The system of claim 17, further comprising at least one optical filtration stage which eliminates infrared, visible, and long ultraviolet wavelengths.

31. The system of claim 17, wherein said second ends of said bundles include closely packed coplanar fiber ends.

32. The system of claim 17, wherein said second ends of said bundles include coplanar flat fiber ends.

33. The system of claim 17, wherein said second ends of said bundles jointly form a polygonal array of fiber ends.

34. A photolithography system, comprising:

a movable wafer stage configured to support and precisely define the location of a wafer of partially fabricated integrated circuits;

a reticle holder configured to support and precisely define the location of a reticle;

an imaging lens configured and positioned to image the reticle held in said reticle holder onto the surface of the wafer held in said wafer stage;

at least two optical sources which emit ultraviolet light; and an optical illumination subsystem which translates ultraviolet light emitted by said sources to provide substantially uniform illumination onto the back side of the reticle held in said reticle holder;

wherein said illumination subsystem comprises multiple bundles of optical fibers, each coupled to a respective one of said optical sources and positioned to collect light therefrom.

35. The system of claim 34, wherein each said optical source is optically filtered to remove wavelengths longer than about 365 nm.

36. The system of claim 34, wherein said imaging lens has a numerical aperture in excess of 0.5.

37. The system of claim 34, wherein said imaging lens provides an image, on said wafer surface, which is reduced from the size of the reticle in said reticle holder.

38. The system of claim 34, wherein each said bundle of optical fibers consists of fibers less than 1 mm in diameter.

39. The system of claim 34, wherein said optical illumination subsystem further comprises an integrator which homogenizes the distribution of light.

40. The system of claim 34, wherein each said bundle of optical fibers consists of fibers less than 300 μm in diameter.

41. The system of claim 34, further comprising at least one optical filtration stage which eliminates visible wavelengths.

42. The system of claim 34, wherein each said optical source operates at an output power of less than one kilo Watt.

43. The system of claim 34, wherein each said optical source operates at an output power of more than 500 Watts.

44. The system of claim 34, further comprising a respective ellipsoidal mirror positioned to reflect light from each arc lamp toward said first end of said respective fiber bundle.

45. The system of claim 34, wherein each said optical source is an arc source.

* * * * *